(12) United States Patent
Gossner

(10) Patent No.: US 7,821,062 B2
(45) Date of Patent: Oct. 26, 2010

(54) FIELD EFFECT TRANSISTOR AND METHOD FOR PRODUCING A FIELD EFFECT TRANSISTOR

(75) Inventor: Harald Gossner, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/432,877

(22) Filed: May 12, 2006

(65) Prior Publication Data

US 2006/0289933 A1    Dec. 28, 2006

(30) Foreign Application Priority Data

May 12, 2005   (DE) .................. 10 2005 022 129

(51) Int. Cl.
*H01L 23/62* (2006.01)
(52) U.S. Cl. ............... 257/335; 257/343; 257/349; 257/336; 438/289; 438/290; 438/291
(58) Field of Classification Search ........... 257/335, 257/343, 349, 336, 339
See application file for complete search history.

(56) References Cited

U.S. PATENT DOCUMENTS

| | | | |
|---|---|---|---|
| 5,844,275 A | 12/1998 | Kitamura et al. | |
| 6,110,803 A | 8/2000 | Tung | |
| 6,127,700 A | 10/2000 | Bulucea | |
| 6,162,688 A * | 12/2000 | Gardner et al. | 438/289 |
| 6,424,005 B1 | 7/2002 | Tsai et al. | |
| 6,548,874 B1 * | 4/2003 | Morton et al. | 257/371 |
| 2002/0117714 A1 * | 8/2002 | Hebert | 257/339 |
| 2003/0022452 A1 | 1/2003 | Petti | |
| 2006/0220120 A1 * | 10/2006 | Horch | 257/341 |

FOREIGN PATENT DOCUMENTS

EP    1 487 023 A2    12/2004

OTHER PUBLICATIONS

SoC Integration in Deep Submicron CMOS, P. Rickert and B. Haroun, Proceedings IEDM 2004, p. 653-656.
High-Voltage Drain Extended MOS Transistors for 0.18-μm Logic CMOS Process, J.C. Mitros, et al., IEEE Transactions on Electron Devices, vol. 48, No. 8, pp. 1751-1755, Aug. 2001.

* cited by examiner

*Primary Examiner*—Michael Trinh
*Assistant Examiner*—Paul E Patton
(74) *Attorney, Agent, or Firm*—Brinks Hofer Gilson & Lione

(57) ABSTRACT

A field effect transistor is provided having a source region, a drain region formed in a first well region, and a channel region. The first well region is doped with doping atoms of a first conductivity type. At least a part of the channel region which extends into the first well region is doped with doping atoms of a second conductivity type, the second conductivity type being a different conductivity type than the first conductivity type.

21 Claims, 7 Drawing Sheets

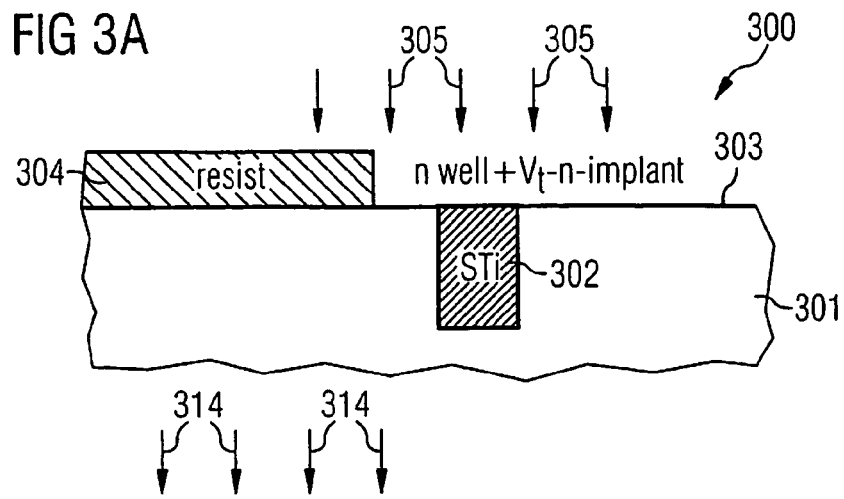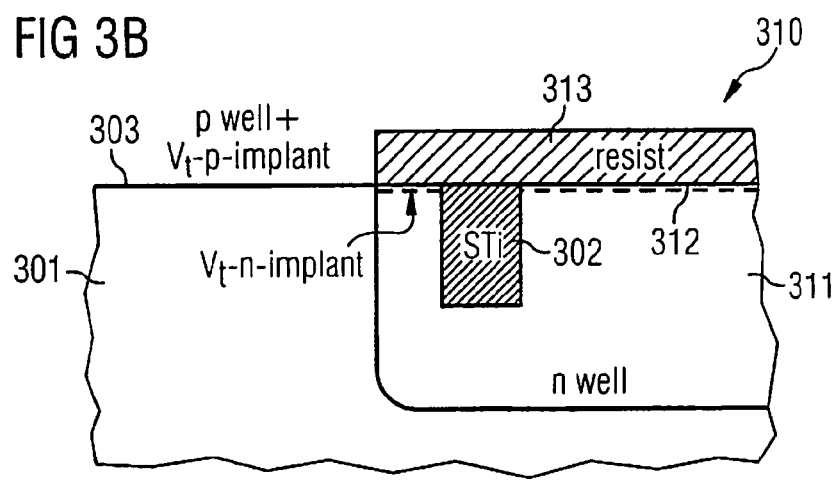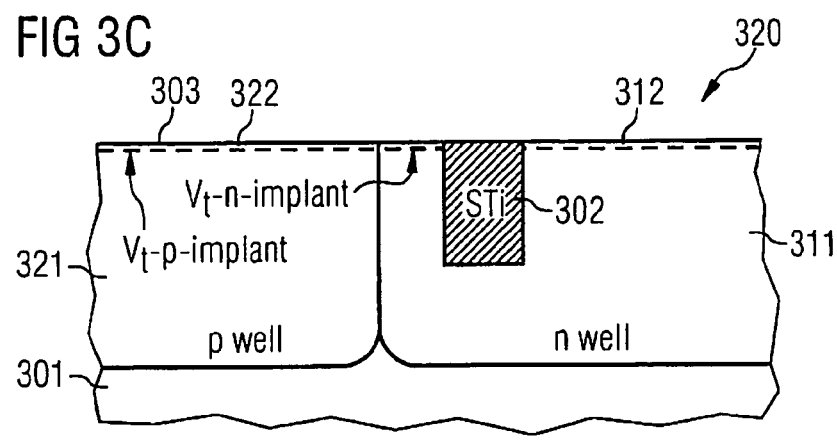

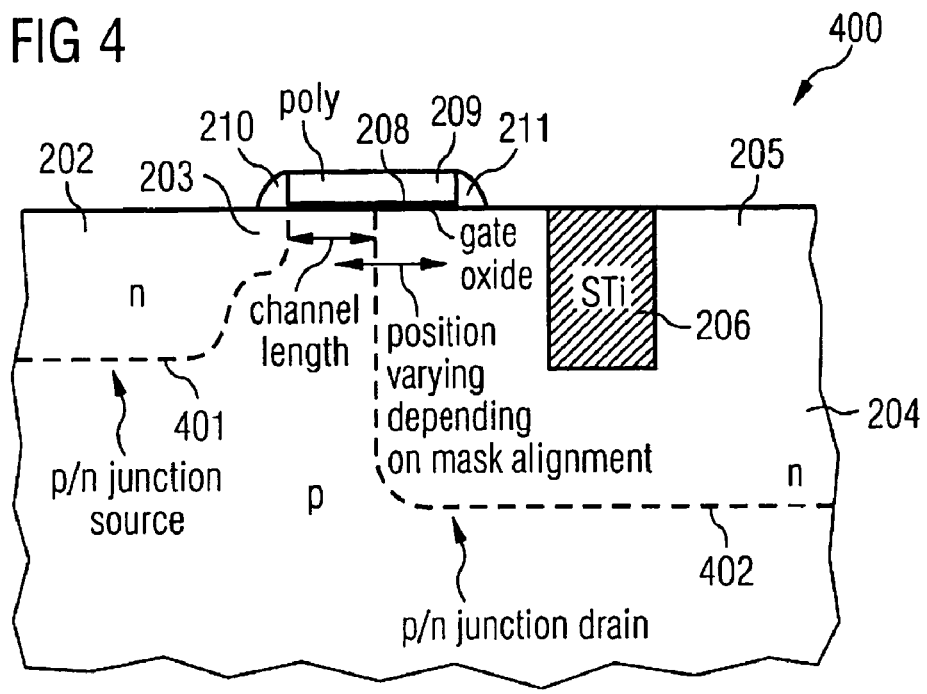
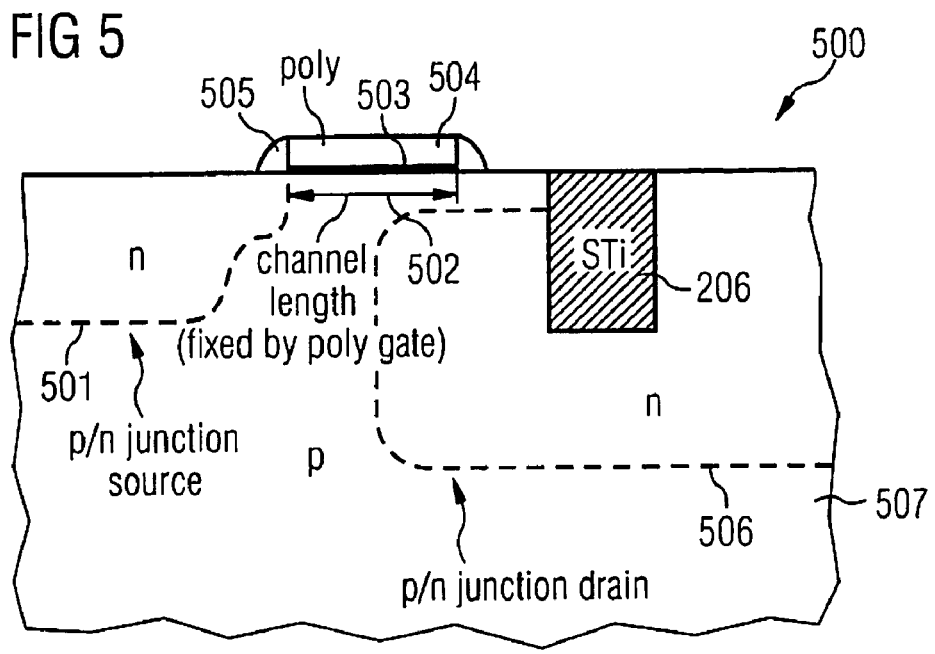

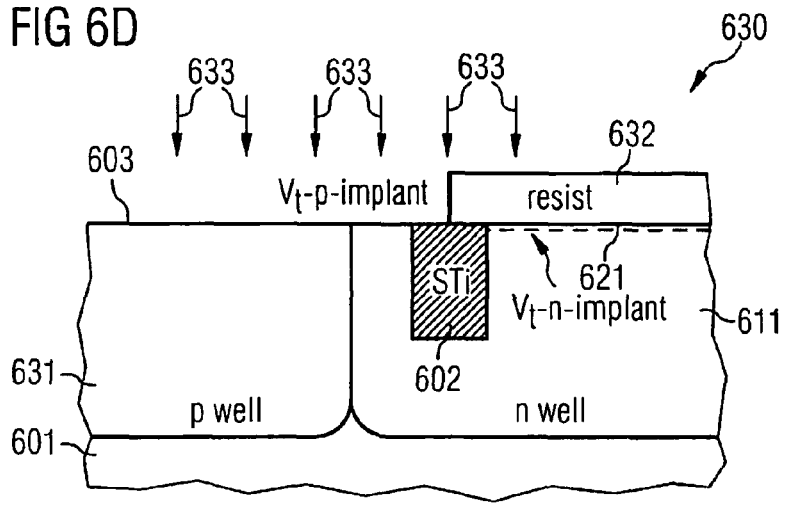
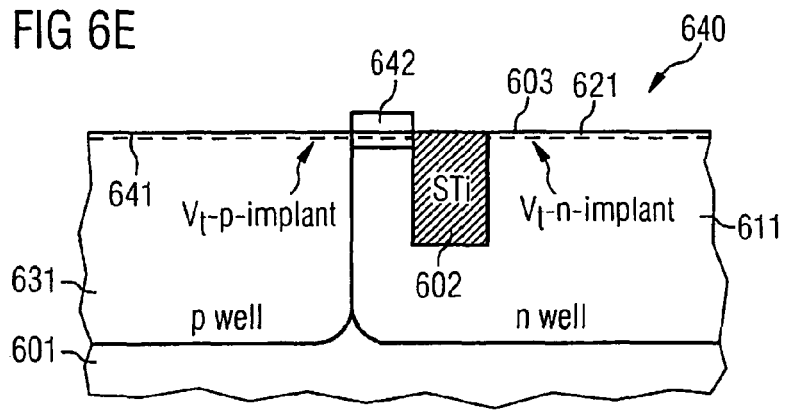
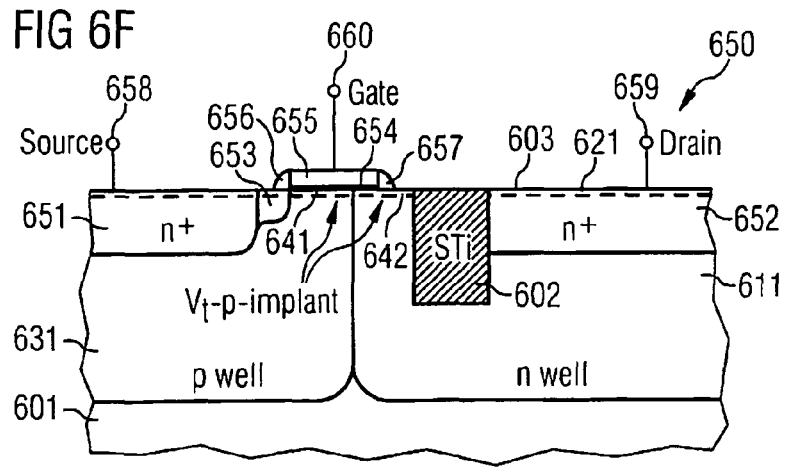

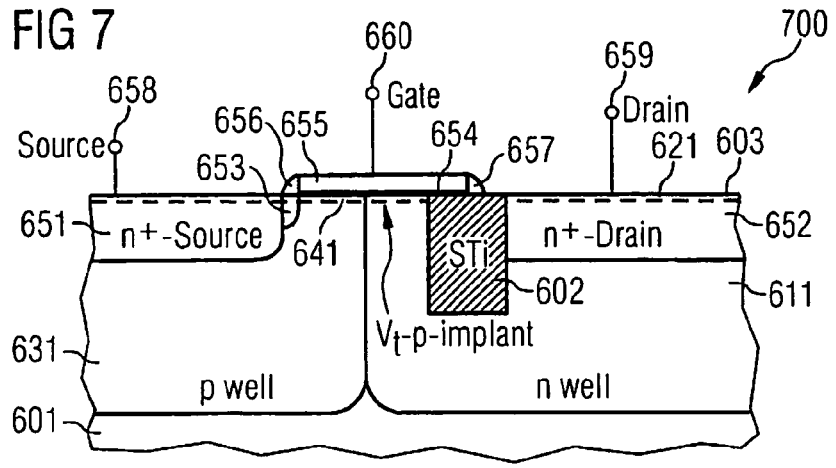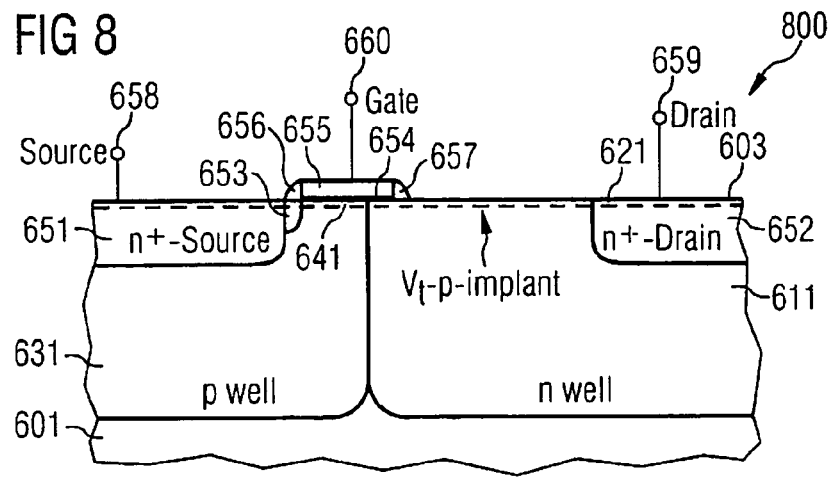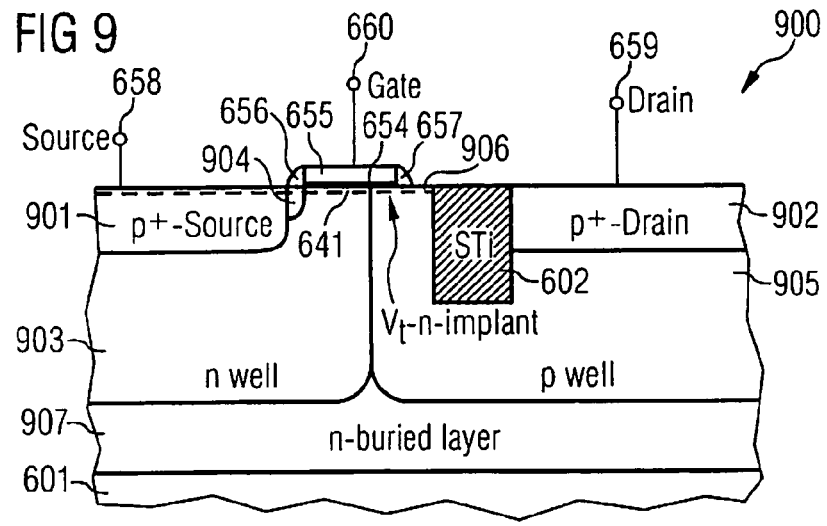

FIELD EFFECT TRANSISTOR AND METHOD FOR PRODUCING A FIELD EFFECT TRANSISTOR

CROSS-REFERENCE TO RELATED APPLICATIONS

This application claims priority to German Patent Application No. 10 2005 022 129.7-33 filed on May 12, 2005.

BACKGROUND

1. Field of the Invention

The invention relates to a field effect transistor and to a method for producing a field effect transistor.

2. Description of the Related Art

In a modern so called system-on-chip circuit arrangement, it is often a challenge to integrate high-voltage interfaces on the chip. In order to satisfy the requirements of a cost effective modern system-on-chip circuit arrangement with regard to the ever increasing complexity of the logic functions to be realized and processing speed of the circuit arrangement, the integrated circuit arrangement is usually processed and produced using advanced CMOS (Complementary Metal Oxide Semiconductor) technology. In the context of advanced CMOS technology, all the process steps are usually optimized with regard to minimizing the feature sizes. In the case of the CMOS field effect transistors fabricated by means of advanced CMOS technology, this optimization usually has the effect that the CMOS field effect transistors have a low breakdown voltage on account of the underlying physical laws.

It is desirable to provide integrated circuit arrangements which can process voltages present in a range of between 10 V and 20 V. Customary standard CMOS field effect transistors have a breakdown voltage of approximately 3 V to 5 V. It is also desirable to avoid additionally required process steps in the context of the production of a suitable CMOS field effect transistor, in order not to increase the costs for the integrated circuit arrangement. It will be appreciated, however, that this arrangement has several disadvantages. The primary disadvantage is that it introduces complexity into the electrical system because of the external circuit components. This complexity is significantly increased in cases where a third power supply needs to be sequenced. Also, the cost of the system is increased as a direct result of the complexity as additional components must be added and space is required to accommodate them.

Various types of so called drain-extended field effect transistors are known which serve for integrating high-voltage driver capability into an advanced CMOS process. What is common to all these different types of known drain-extended field effect transistors is the reduction of the voltage drop across the gate oxide by implementing a space charge zone on the drain side.

FIGS. 1A, 1B and 1C show three different examples of such conventional field effect transistors. FIG. 1A shows a conventional NMOS field effect transistor 100, which has an n highly doped ($n^+$ doped) source region 101 and an adjoining n lightly doped (n doped) drain region 102 and an n lightly doped ($n^-$ doped) first well region 103, in which an n highly doped ($n^+$ doped) drain region 104 is introduced. Between the lightly doped drain region 102 and the first well region 103, a channel region 106 is provided in the substrate 105 made of silicon. The substrate 105 is p doped. A silicon dioxide layer 108 is applied as a gate insulation layer on the surface 107 of the substrate, and a gate region 109 made of polysilicon is applied on said layer.

FIG. 1B shows another conventional NMOS field effect transistor 120. There is introduced into a p doped substrate made of silicon 121 an n highly doped ($n^+$ doped) source region 122 and adjoining the latter an n doped lightly doped drain region 123. An n highly doped ($n^+$ doped) drain region 124 is furthermore provided. An n very lightly doped ($n^-$ doped) region 125 is provided adjoining the drain region 124 in the direction of the source region 122. The very lightly doped $n^-$ region 125 has an increased electrical resistance compared with the n highly doped drain region 124. A channel region 126 is provided between the lightly doped drain region 123 and the very lightly doped region 125. In the channel region, the electrically conductive channel can form if appropriate upon corresponding application of electrical potentials to the source region 122, the drain region 124 and the gate region 129. Above the channel region 126, a silicon dioxide layer 128 is applied as a gate insulation layer on the surface 127 of the substrate 121 and a gate region 129 made of polysilicon is applied on said layer.

FIG. 1C shows another conventional field effect transistor 140. The field effect transistor 140 has a p doped substrate 141, in which there is introduced an n highly doped ($n^+$ doped) source region 142 and adjoining the latter an n doped lightly doped drain region 143. An n lightly doped ($n^-$ doped) first well region 144 is furthermore provided, in which an n highly doped ($n^+$ doped) drain region 145 is introduced. Furthermore, in the first well region 144, an insulator structure is introduced into the first well region 144 as a trench 146 filled with electrically insulating material and adjoining the drain region 145. A channel region 147 is provided between the first well region 144 and the lightly doped drain region 143, on the surface 148 of the substrate 141 a silicon dioxide layer 149 being formed as a gate insulation layer above both the channel region 147 and a part of the first well region 144. A gate region 150 made of polysilicon is formed on the gate insulation layer 149.

FIG. 2 shows a drain-extended NMOS field effect transistor 200, the gate region overlapping a Shallow Trench Isolation (STI) region. The field effect transistor 200 has an n highly doped ($n^+$ doped) source region 202 introduced into a p doped substrate 201, an n doped lightly doped drain region (LDD region) 203 adjoining said source region. Furthermore, an n lightly doped ($n^-$ doped) first well region 204 is provided, in which a drain region 205, n highly doped ($n^+$ doped), is introduced. A shallow trench insulator structure 206 is formed in the first well region 204, in accordance with this embodiment described there formed as a trench filled with an electrical insulation material. Between the first well region 204 and the lightly doped drain region 203, a channel region 207 is provided in the substrate 201, in which channel region an electrically conductive channel can form given corresponding electrical driving. Above the channel region, the channel-side part of the first well region 204 and partly or completely above the shallow trench insulator structure 206, a gate insulation layer 208 made of silicon dioxide is formed and a gate region 209 made of polysilicon is formed thereon. Sidewall spacers 210, 211 are formed on the sidewalls of the gate insulation layer 208 and the gate region 209.

The field effect transistors illustrated in FIGS. 1A to 1C and FIG. 2 are based, in the context of their use, on the presumption that the gate region is always operated in a low voltage range and the high voltage (in the range of 5 V to 20 V) occurs exclusively at the drain region of the respective field effect transistor. In the case of the field effect transistors 100, 120 shown in FIG. 1A and FIG. 1B, self-aligned production of an NMOS field effect transistor is made possible by use of the lightly doped drain region 102, 123, the production of such a high-voltage field effect transistor being able to be controlled very well. However, on account of the relatively high doping concentration with doping atoms in the respective n doped lightly doped drain region 102, 123, the respective field effect transistor can only be used up to an electrical voltage present at the drain region 104, 124 with a magnitude of approximately 5 V.

For even higher voltage requirements the NMOS field effect transistor 140 illustrated in FIG. 1C is provided, in the case of which drain voltages in a range of 10 V and beyond can still be processed. This is made possible by use of the insulator structure 149. However, on account of the required mask alignment of the n well mask and the gate mask instead of the self-alignment such as can be used in the production of a customary field effect transistor, a considerable and non-negligible variation of the "effective" gate length or the channel length occurs in the production of an exemplary field effect transistor 140 in FIG. 1C, which leads to severe fluctuations in the field effect transistor parameters. The breakdown voltage, in particular, is of particular importance in the context of ESD (electrostatic discharge) protection.

The first well regions are used as space charge zones in order to reduce the voltage drop between the source region and the drain region or the drain region and the gate region. Clearly, the first well region or the very lightly doped region 125 is used as a resistance element, so that a voltage divider is formed, a voltage corresponding to the corresponding resistance of the first well region or the very lightly doped region 125 being dropped in this region and no longer between source region and drain region or drain region and gate region.

Accordingly, there is a need for less complex and low cost integrated circuit arrangement having an interface which can process voltages over a broad range.

SUMMARY

According to one embodiment, a field effect transistor comprises a source region being doped with doping atoms of a first conductivity type. Furthermore, the field effect transistor comprises a drain region being doped with doping atoms of the first conductivity type. The field effect comprises a first well region, in which the drain region is arranged, the first well region being doped with doping atoms of the first conductivity type. Additionally the field effect transistor comprises a channel region between the source region and the drain region, wherein the channel region extends partly into the first well region. Furthermore the field effect transistor comprises a gate insulation layer above the channel region, wherein the channel region extends over the entire length of the gate insulation layer or as far as an insulator structure formed between the source region and the drain region. The field effect transistor may further include a gate region above the gate insulation layer. At least a part of the channel region which extends into the first well region is doped with doping atoms of a second conductivity type, wherein the second conductivity type is a different conductivity type than the first conductivity type, and wherein the doping atoms of the second conductivity type are implanted into the part of the channel region using a process step for setting the field effect transistor threshold voltage.

In accordance with an embodiment of the invention, the first well region is more lightly doped with the doping atoms of the first conductivity type with regard to the doping concentration than the drain region.

In accordance with another embodiment of the invention, the source region and the drain region are highly doped with the doping atoms of the first conductivity type, for example with $10^{19}$ cm$^{-3}$ to $10^{23}$ cm$^{-3}$. In the channel region, an electrically conductive channel may be formed upon application of corresponding electrical potentials to the source region, the drain region and to the gate region and, if appropriate, to a bulk terminal of the field effect transistor.

In accordance with another embodiment of the invention, the gate insulation layer is formed on the channel region.

In accordance with another embodiment of the invention, the gate region is formed on the gate insulation layer.

In accordance with another embodiment of the invention, the second conductivity type corresponds to the conductivity type of the doping atoms used for doping the substrate in or on which the field effect transistor is formed.

Clearly, one aspect of the invention can be seen in the opposite doping, near the surface, of a region of the first well region, the region provided with the opposite doping being arranged between the drain region and the source region of the field effect transistor in such a way that a region having an increased electrical resistance is formed between the channel region and the region with the opposite doping, so that clearly an electrical voltage divider arises in such a way that a part of the high voltage (for example 5 V to 20 V or more volts) present at the drain region is dropped in the region of the first well region which is provided with the opposite doping, and, consequently, reduces the voltage drop between the source region and the drain region or the gate region and the drain region.

The opposite doping near the surface in the first well region makes it possible to provide a very precisely defined channel length. For this purpose, by way of example, the opposite doping in the first well region with the doping with doping atoms of the first conductivity type is performed only below the gate region, that is to say in a region in which the inversion layer that forms the electrical channel is formed. By way of example, the opposite doping near the surface may be effected by means of a field effect transistor threshold voltage doping atom implantation (p doping atom implantation in the case of an n-channel MOS field effect transistor or n doping atom implantation in the case of a p-MOS field effect transistor), the implantation process being available in a CMOS standard process and being used for example for forming the p well in the case of an NMOS field effect transistor and for forming the n well in the case of a PMOS field effect transistor.

If the implantation is also effected in a region of the first well region which is situated outside the zone which is situated below the gate region, the channel length will furthermore be defined by the length of the gate region, which is formed from polysilicon for example.

The process sequence used is fully compatible with the standard CMOS process which is used for producing low-voltage devices, that is to say low-voltage MOS field effect transistors.

In accordance with another embodiment of the invention, it is provided that outside the channel region a region in the first well region between the part of the channel region which is doped with doping atoms of the second conductivity type and the drain region additionally is doped with doping atoms of the second conductivity type.

The part of the channel region which is doped with doping atoms of the second conductivity type may be formed in a surface region of the channel region; by way of example, the surface region may extend from the upper interface of the channel region or substrate to a maximum of 40 nm into the substrate in or on which the field effect transistor is formed.

However, the surface region may also extend from a region arranged at a distance of at least 5 nm from the upper interface of the channel region to a maximum of 40 nm into the substrate in or on which the field effect transistor is formed. Furthermore, the region may be arranged at a distance of at least 10 nm from the upper interface of the channel region and extend to a maximum of 20 nm to 30 nm into the substrate. The substrate may be fabricated from silicon, in which case the gate insulation layer is a silicon dioxide layer for example; in general, the gate insulation layer in accordance with one embodiment of the invention is an oxide layer.

In accordance with another embodiment of the invention, the substrate may comprise any suitable semiconductor material, for example a compound semiconductor material, for example a II/VI compound semiconductor material or a III/V compound semiconductor material, and in this case for example gallium arsenide (GaAs), indium phosphide (InP), as an alternative also a ternary compound semiconductor material or a quaternary compound semiconductor material.

In general, the field effect transistor may be any arbitrary suitable metal insulator semiconductor field effect transistor (MISFET), but the field effect transistor is preferably formed as a MOS field effect transistor (Metal Oxide Semiconductor field effect transistor), for example as a CMOS field effect transistor (Complementary Metal Oxide Semiconductor). The field effect transistor may also be formed as an SOI field effect transistor (Silicon on Insulator field effect transistor) for the case where the channel region is partially depleted (PD) of electrical charge carriers. For the case where the channel region is formed as a partially depleted channel region, the field effect transistor may also be formed as an SoS field effect transistor (Silicon on Sapphire field effect transistor).

The doping atoms of the first conductivity type may be electron donors, for example V-valent atoms, such as arsenic or phosphorus for example, and the doping atoms of the second conductivity type may be electron acceptors, for example III-valent atoms such as boron for example. In this case, the source region, the drain region and the first well region are n doped and the opposite doping has a p doping.

In yet another embodiment of the invention, the doping atoms of the first conductivity type are electron acceptors and the doping atoms of the second conductivity type are electron donors, it being possible in each case for the doping atoms described above to be used correspondingly. To put it another way, this means that, in accordance with this embodiment of the invention, the source region, the drain region and the first well region are p doped and the opposite doping is an n doping. By way of example, for the case where the field effect transistor is fabricated using CMOS technology, a second well region is provided, in which the source region is arranged, the second well region being doped with doping atoms of the second conductivity type. In the case of the embodiment of the invention in which the substrate is produced from silicon, the gate region is formed for example from polysilicon.

For the purpose of increasing the breakdown voltage further and thus for the purpose of a more voltage-stable configuration of the field effect transistor, in accordance with another embodiment of the invention, an insulator structure is provided between the region of the channel region which is doped with doping atoms of the second conductivity type and the drain region. The insulator structure may be a trench filled with electrically insulating material; that is to say, by way of example, the insulator structure may be a so-called Shallow Trench Isolation (STI), as an alternative the insulator structure may be formed by means of local oxidation as a so-called LOCOS region.

In accordance with still yet another embodiment of the invention, the insulator structure is formed, dimensioned and arranged within the field effect transistor in such a way that a space charge zone can form from the drain region around the insulator structure as far as the channel region. Consequently, the insulator structure on the one hand forms an increased electrical resistance between the channel region and the drain region, but it is still possible for an electrically conductive channel to be formed between the source region and the drain region, whereby the functionality of the field effect transistor continues to be ensured.

The first well region and the second well region may be arranged at a predetermined distance, which is greater than 0 nm for example, from one another in the substrate. By virtue of the increased distance clearly between the p well doping and the n well at the drain side, it is possible to obtain higher breakdown voltages and thus higher voltages that can be applied to the drain.

In the context of the so-called triple well architecture, another embodiment of the invention provides for a third well region to be provided below the first well region and the second well region.

In a method for producing a field effect transistor a first well region is formed, wherein the first well region is doped with doping atoms of a first conductivity type. A part of the first well region is doped with doping atoms of a second conductivity type, wherein the second conductivity type is a different conductivity type than the first conductivity type. The doping atoms of the second conductivity type are implanted into the part of the first well region using a process step for setting the field effect transistor threshold voltage. A source region is formed, wherein the source region is doped with doping atoms of the first conductivity type. A drain region is formed in the first well region, wherein the drain region is doped with doping atoms of the first conductivity type. A channel region is formed between the source region and the drain region, wherein the channel region partly extends into the first well region, and wherein the channel region contains at least a part of the part of the first well region which is doped with doping atoms of the second conductivity type. A gate insulation layer is formed above the channel region, wherein the channel region extends over the entire length of the gate insulation layer or as far as an insulator structure formed between the source region and the drain region. A gate region is formed above the gate insulation layer.

Another embodiment of the method provides for the doping atoms of the second conductivity type to be implanted into the part of the first well region.

Another embodiment of the invention provides for the doping atoms of the second conductivity type to be implanted into the part of the first well region using a process step for setting the field effect transistor threshold voltage. In this way, an opposite doping near the surface and thus an increase in the breakdown voltage of the field effect transistor are achieved very cost-effectively using a standard process in the context of the production of a CMOS field effect transistor.

Another embodiment of the invention provides for an insulator structure to be formed in the first well region. Furthermore, a second well region may be formed, the second well region being doped with doping atoms of the second conductivity type. The source region is formed in the second well region.

An advantage of the invention can be seen in that a field effect transistor and a method for producing a field effect transistor are specified, in which a high drain-side voltage can be processed in a simple and cost-effective manner. Another advantage of the invention can be seen in that in the context of the production method in customary CMOS standard processes no new technologies are required.

The field effect transistor is suitable for use in various areas, for example in a system-on-chip, that is to say in an integrated circuit arrangement which is used in a system-on-chip circuit arrangement, as an input/output interface transistor, that is to say as an input/output driver transistor. As an alternative, the field effect transistor is also suitable as an ESD protection field effect transistor (ESD: Electrostatic Discharge). By way of example, when the field effect transistor is used as an input/output driver field effect transistor, the latter may be used for example in the area of telephony, that is to say in the context of the connection of a telephone line, for example an A/B line, in which an external electrical voltage having a magnitude of between 10 V and 20 V occurs. Another field of application is the area of automotive control, in which different relatively high voltages, for example electrical voltages having a magnitude of 5 V for the power supply of logic circuits, occur and must not lead to the destruction of the low-voltage CMOS field effect transistors.

A considerable advantage of the invention is to be seen in the fact that the effective gate length always remains the same and is not dependent on the accuracy of the alignment of the gate in the context of the production process.

According to another embodiment of the invention, a field effect transistor is provided, comprising a source region, a drain region, and a first well region in which the drain region is arranged, wherein the first well region and the drain region are doped with doping atoms of the same conductivity type. The field effect transistor further comprises a channel region between the source region and the drain region, wherein the channel region extends partly into the first well region. The field effect transistor comprises a gate insulation layer above the channel region, wherein the channel region extends over the entire length of the gate insulation layer or as far as an insulator structure formed between the source region and the drain region. Furthermore, the field effect transistor comprises a gate region above the gate insulation layer. At least a part of the channel region which extends into the first well region is doped with doping atoms of a second conductivity type different from that of the drain region, wherein the doping atoms of the second conductivity type are implanted into the part of the channel region using a process step for setting the field effect transistor threshold voltage.

According to another embodiment of the invention a field effect transistor is provided which comprising a source region being doped with doping atoms of a first conductivity type. The field effect transistor further comprises a drain region being doped with doping atoms of the first conductivity type. The field effect transistor comprises a first well region, in which the drain region is arranged, wherein the first well region being is doped with doping atoms of the first conductivity type. Furthermore, the field effect transistor comprises a channel region between the source region and the drain region, wherein the channel region extends partly into the first well region. The field effect transistor further comprises a gate insulation layer above the channel region, wherein the channel region extends over the entire length of the gate insulation layer or as far as an insulator structure formed between the source region and the drain region. Furthermore, the field effect transistor comprises a gate region above the gate insulation layer. At least a part of the channel region which extends into the first well region is doped with doping atoms of a second conductivity type, wherein the second conductivity type is a different conductivity type than the first conductivity type. The doping atoms of the second conductivity type are implanted into the part of the channel region using a process step for setting the field effect transistor threshold voltage. The part of the channel region which is doped with doping atoms of the second conductivity type is formed in a surface region of the channel region. The surface region extends from a region arranged at a distance of at least 10 nm from the upper interface of the channel region to a maximum of 20 nm into the substrate in or on which the field effect transistor is formed.

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIGS. 3A to 3C are schematic diagrams illustrating the standard process flow in the context for well formation and for threshold voltage implantation of doping atoms;

FIG. 4 is a schematic diagram illustrating a field effect transistor with an illustration of the respective doping atom profiles;

FIG. 5 is a schematic diagram illustrating a field effect transistor in accordance with one exemplary embodiment of the invention with an illustration of the associated doping atom profiles;

FIGS. 6A to 6F are schematic diagrams illustrating a production method for producing a field effect transistor in accordance with one exemplary embodiment of the invention at different points in time during production;

FIG. 7 is a schematic diagram illustrating a field effect transistor in accordance with a second exemplary embodiment of the invention;

FIG. 8 is a schematic diagram illustrating a field effect transistor in accordance with a third exemplary embodiment of the invention; and FIG. 9 is a schematic diagram illustrating a field effect transistor in accordance with a fourth exemplary embodiment of the invention.

DETAILED DESCRIPTION

Figure 1A:
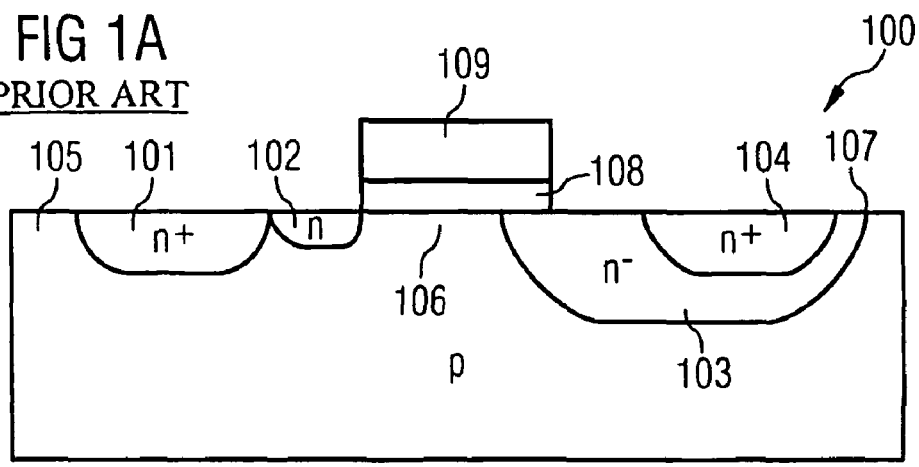
FIGS. 1A, 1B, 1C and 2 are schematic diagrams illustrating conventional field effect transistors.
Figure 1B:
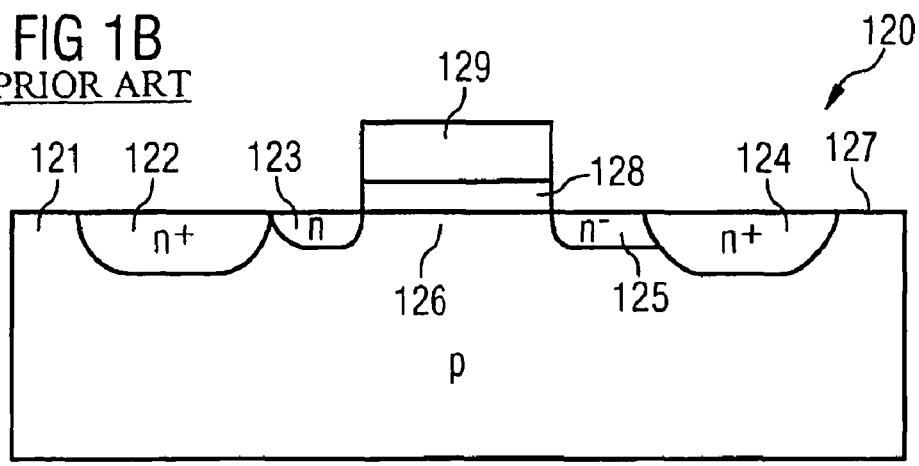
Figure 1C:
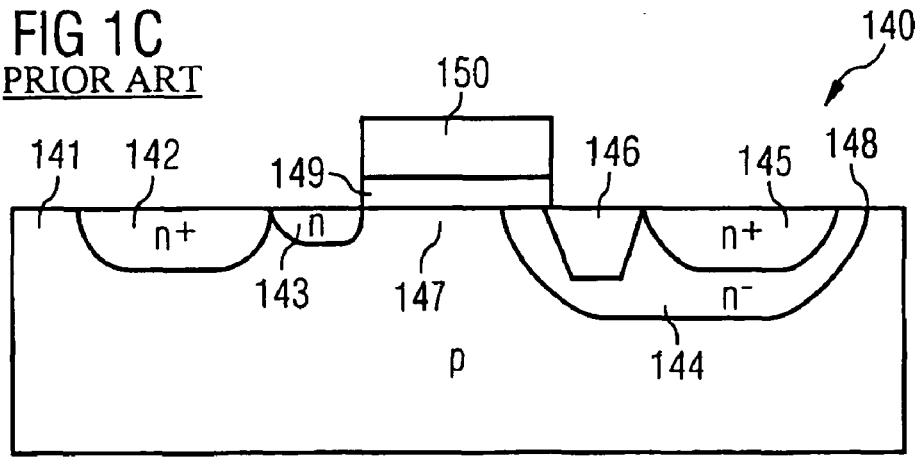
Figure 2:
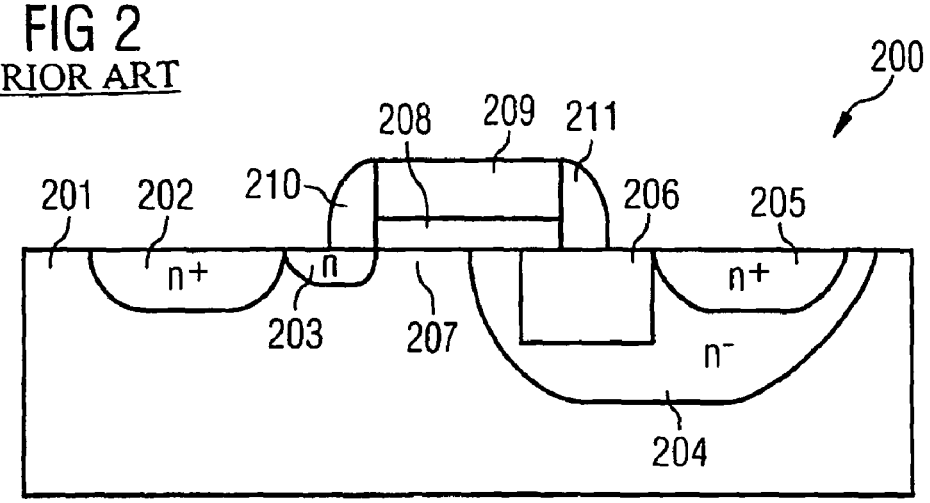

Referring to FIG. 4, a field effect transistor 400, in the case of which a profile 401 of a first pn junction between the source region and the lightly doped drain region usually adjoining the latter, on the one hand, and the substrate, on the other hand, is illustrated. The field effect transistor 400, has a second pn junction 402 between the space charge zone, proceeding from the drain region around the shallow trench isolation region, and the substrate.

As can be gathered from FIG. 4, the extent of the space charge zone 402 below the gate region of the field effect transistor 400 is variable and dependent on the alignment accuracy of the masks in the context of the production process.

As illustrated in FIG. 5, the field effect transistor 500 in accordance with one embodiment of the invention, the doping atom profile on the source side is essentially identical. That is to say that given the provision of a source region with a lightly doped drain region, the result is a stepped profile 501 of the first pn junction between the source region and the lightly doped drain region that usually adjoins the latter and the substrate 507, the boundary of the source-side pn junction 501 ending directly at the transition between the source-side spacer 505 of the gate region and the polysilicon material or the silicon dioxide material of the gate region. The channel region 502 always extends precisely below the gate region, the channel length of the channel region 502 being defined by the width of the gate insulation layer 503 made of silicon oxide or the width of the gate region 504 made of polysilicon.

The doping atom concentration profile 506, the drain-side pn junction and the profile of the drain-side space charge zone are likewise illustrated in FIG. 5. It is evident that the opposite doping near the surface, which will be explained in more detail below, has the effect that the space charge zone does not extend into the channel region 502.

As is illustrated in FIG. 6A to FIG. 6F, it may be necessary depending on the ratio between the threshold voltage implantation dose of the n well and the threshold voltage implantation dose of the p well to provide one or two additional lithography steps in the context of the production method. However, these masks are not expensive high-resolution masks. A first mask is used to ensure that the threshold voltage p doping atom implantation extends right into the n well region of the field effect transistor, and the other mask may be necessary to block, that is to say prevent, the threshold voltage n doping atom implantation in this region. It should be pointed out that the process flow described in FIG. 6A to FIG. 6F is fully compatible with the standard CMOS process for producing low-voltage devices.

Figure 6A:
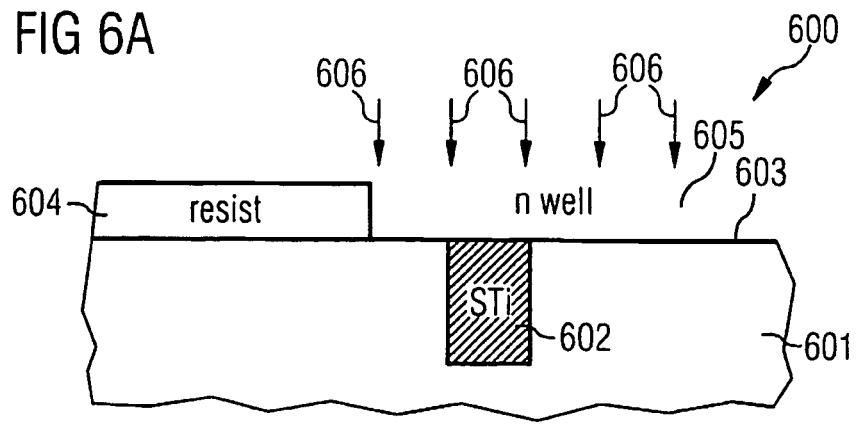
Figure 6B:
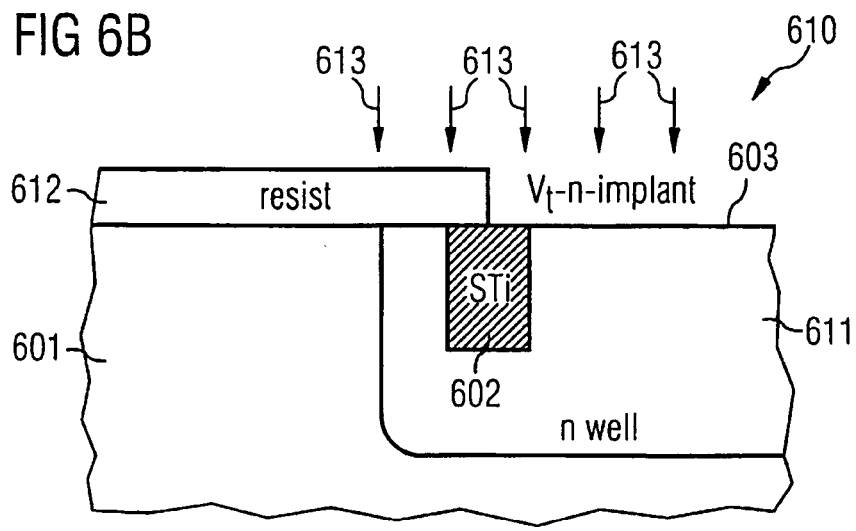

FIG. 6A shows a silicon substrate 601 in a first diagram 600, said silicon substrate being p doped with boron atoms. A multiplicity of shallow trench isolation trenches are formed as insulator structures 602 in the substrate 601. For exemplary purposes, only one shallow trench isolation 602 is illustrated in FIG. 6A in order to simplify the illustration. A patterned first photoresist layer 604 is applied on the upper surface 603 of the substrate 601. The surface region above the shallow trench isolation 602 and also a partial region on the left and on the right alongside the shallow trench isolation 602 are free of the photoresist 604. The shallow trench isolation 602 has a trench depth of between 350 and 450 nm.

Consequently, the first photoresist layer 604 is applied to the surface 603 of the substrate 601 and patterned in such a way that a partial surface region 605 of the substrate is uncovered for receiving doping atoms in the context of an n doping atom implantation. The n doping atom implantation is subsequently carried out is represented by arrows 606 in FIG. 6A.

After the production of a first well region, an n well region 611 in accordance with this exemplary embodiment of the invention (see second diagram 610 in FIG. 6B), the first photoresist layer 604 is removed, and a second photoresist layer 612 is applied and patterned in such a way that only a partial region of the upper surface of the shallow trench isolation 602 and a region situated on the right thereof are not covered by the photoresist material, in which case the drain region of the field effect transistor to be produced is intended to be formed in the uncovered region.

A threshold voltage n doping atom implantation is subsequently carried out using arsenic atoms or phosphorus atoms (symbolized by means of arrows 613 in FIG. 6B), as a result, a $V_t$ n implantation region is formed in a surface region 621 in the n well region 611. The $V_t$ n implantation region and thus the surface region 621 extends up to 20 nm to 40 nm into the substrate 601, beginning approximately 5 nm to 10 nm from the upper surface 603 of the substrate.

Figure 6C:
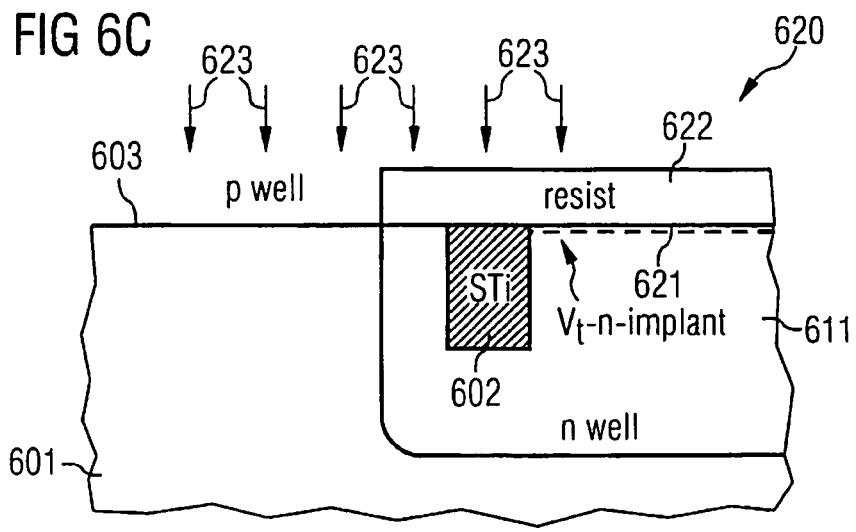

As is illustrated in a third diagram 620 in FIG. 6C, the second photoresist layer 612 is removed and a third photoresist layer 622 is applied to the upper surface 603 of the substrate 601. The third photoresist layer 622 is patterned in such a way that the region situated laterally outside the n well region 611 (the left-hand region in FIG. 6C) is not covered by photoresist material.

In the uncovered region, a p well region 631 is formed by means of implantation of p doping atoms, such as boron for example (symbolized by arrows 623 in FIG. 6C), in a manner known (see fourth diagram 630 in FIG. 6D).

The p well region 631 and the n well region 611 may directly adjoin one another, but it may be provided that a tolerance distance is provided between the p well region 631 and the n well region 611. The distance between the p well region 631 and the n well region 611 may amount to a few hundred nm, for example 400 nm to 500 nm.

After the formation of the p well region 631, the third photoresist layer 622 is removed and a fourth photoresist layer 632 is applied and patterned in such a way that the p well region 631 is completely uncovered and the surface region of the n well region 611 between the p well region 631 and the shallow trench isolation 602 is likewise uncovered, it also being possible for a part of the upper surface of the shallow trench isolation 602 itself to be uncovered.

In the regions not covered by the fourth photoresist layer 632, a threshold voltage p doping atom implantation ($V_t$ p implantation) that is known per se is carried out using p doping atoms, such as boron (symbolized by arrows 633 in FIG. 6D), whereby a threshold voltage p doping atom implantation region 641 is formed in the p well region 631 and also in the part of the n well region 611 which is arranged between the p well region 631 and the shallow trench isolation region 602 (see fifth diagram 640 in FIG. 6E).

Consequently, in the part of the n well region 611 between the shallow trench isolation 602 and the p well region 641, a region 642 near the surface is formed in which clearly an opposite doping is effected, that is to say a doping which is opposite to the well doping of the n well region 611 in which the drain region is intended to be formed.

As is illustrated in a sixth diagram 650 in FIG. 6F, subsequently by means of n doping using arsenic or phosphorus atoms, an $n^+$ doped source region 651 is formed in the p well region 631, and a drain region 652 is also formed, Likewise highly doped with n doping atoms ($n^+$ doped) (that is to say with a doping concentration of between $10^{19}$ and $10^{23}$ cm$^{-3}$), the drain region 652 are formed in the n well region 611.

Furthermore, a source-side n doped lightly doped drain region 653 adjoining the source region 651 is formed, and also a gate insulation layer 654 made of silicon dioxide, and a layer made of polysilicon, which forms the gate region 655, is applied and the stack comprising gate insulation layer 654 and gate region 655 is patterned and sidewall spacers 656, 657 are subsequently formed. The source region 651 is coupled to a source terminal 658, the drain region 652 is coupled to a drain terminal 659, and the gate region 655 is coupled to a gate terminal 660.

It should be noted in this connection that the doping of the retrograde n well 611 in the vicinity of the silicon surface, that is to say in the surface region near the upper surface 603 of the substrate 601, is low, particularly for the case where the threshold voltage n doping atom implantation is blocked. It is usually only $10^{15}$ cm$^{-3}$. The threshold voltage p doping implantation results in a typical maximum doping concentration in a range of between $10^{17}$ cm$^{-3}$ and $10^{18}$ cm$^{-3}$ in the vicinity of the silicon surface. Therefore, the doping profile below the gate region 655 is changed considerably by the process illustrated in FIG. 6A to FIG. 6F and the process described above, as is illustrated in FIG. 5.

Independently of the exact position of the junction between the n well region 611 and the p well region 631 below the gate region 655, the channel extends from the source-side diffusion region edge as far as the edge of the gate region 655 (drain-side) and is composed of polysilicon material. The channel length is thus exclusively defined by the length of the polysilicon gate region 655. Mask misalignment of the well masks no longer influences the electrical behavior of the field effect transistor, at least not to a first approximation. Therefore, the field-effect transistor clearly has a self-aligned gate length. The drain-side extension is achieved by means of the n well region as drain region, the drain extension being connected to the gate.

The effect of the misalignment of the n well mask is eliminated by opposite doping of the n well region in the surface region near to the surface of the silicon substrate by means of a shallow p implantation. As described above, this can be accomplished by means of the threshold voltage p doping atom implantation which is available in a standard CMOS process.

FIG. 7 shows a CMOS field effect transistor 700 in accordance with a second exemplary embodiment of the invention. The field effect transistor 700 in accordance with the second exemplary embodiment differs from the field effect transistor in accordance with the first exemplary embodiment in that the gate region 655 extends laterally as far as over the shallow trench isolation 602, so that, in accordance with this exemplary embodiment of the invention, no uncovered region 642 is provided between the drain-side sidewall spacer 657 and the shallow trench isolation 602. In accordance with this exemplary embodiment of the invention, the n well region 611 extends into the substrate 601 by up to 0.8 μm, 1 μm, . . . , 1.5 μm. In accordance with this embodiment of the invention, the p well region 631 extends into the substrate 601 as far as a depth of 0.8 μm, to 1 μm, . . . , 1.5 μm.

FIG. 8 shows a CMOS field effect transistor 800 in accordance with a third exemplary embodiment of the invention, no shallow trench isolation 602 being provided in accordance with this embodiment of the invention. The field effect transistor 800 in accordance with the third exemplary embodiment of the invention is otherwise identical to the CMOS field effect transistor in accordance with the first exemplary embodiment of the invention.

FIG. 9 shows a CMOS field effect transistor 900 in accordance with a fourth exemplary embodiment of the invention, the CMOS field effect transistor 900 in accordance with this exemplary embodiment of the invention being a p-MOS field effect transistor, that is to say that the source region 901 and the drain region 902 are p highly doped ($p^+$ doped) with boron as doping atoms and the respective dopings in each case correspond to the other conductivity type compared with the CMOS field effect transistor in accordance with the first exemplary embodiment of the invention. This means, inter alia, that the source region 901 is arranged in an n well region 903 and the lightly doped drain region 904 is also p doped on the source side. Furthermore, the drain region 902 is arranged in a p well region 905 and the opposite doping is effected by means of a threshold voltage n doping atom implantation, whereby an n doped region 906 is arranged in the surface region of the p well region 905 between the n well region 903 and the shallow trench isolation 602. Furthermore, a buried n doped layer 907 is provided below the n well region 903 and the p well region 905.

Further embodiments of the invention provide for configuring a p-channel CMOS field effect transistor as illustrated in FIG. 9 in a correspondingly analogous manner to that as illustrated for an n-channel CMOS field effect transistor in FIG. 7 and FIG. 8. That is to say, for example, with a gate region which extends as far as the shallow trench isolation, or a p-channel CMOS field effect transistor without shallow trench isolation.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

The invention claimed is:

1. A field effect transistor, comprising
a source region being doped with doping atoms of a first conductivity type;
a drain region being doped with doping atoms of the first conductivity type;
a first well region, in which the drain region is arranged, the first well region being doped with doping atoms of the first conductivity type;
a channel region between the source region and the drain region, a portion of the channel region being located in the first well region;
a gate insulation layer above the channel region, the channel region extending over the entire length of the gate insulation layer or as far as an insulator structure formed between the source region and the drain region;
a gate region above the gate insulation layer;
at least a part of the portion of the channel region which is located in the first well region being doped with doping atoms of a second conductivity type, the second conductivity type being a different conductivity type than the first conductivity type;
wherein the doping atoms of the second conductivity type is implanted into the part of the portion of the channel region using a process step for setting the field effect transistor threshold voltage;
wherein the part of the channel region which is doped with doping atoms of the second conductivity type is formed in a surface region of the channel region; and
wherein the surface region extends from a region arranged at a distance of at least 5 nm from the upper interface of the channel region to a maximum of 40 nm into the substrate in or on which the field effect transistor is formed.

2. The field effect transistor as claimed in claim 1, further comprising a doped region arranged in the first well region and outside the channel region, wherein said doped region is arranged between the drain region and the part of the channel region doped with doping atoms of the second conductivity type, and wherein said doped region is doped with doping atoms of the second conductivity type.

3. The field effect transistor as claimed in claim 1, wherein the surface region extends a distance of at least 10 nm from the upper interface of the channel region to a maximum of 20 nm into the substrate in or on where the field effect transistor is formed.

4. The field effect transistor as claimed in claim 1, wherein the gate insulation layer is an oxide layer.

5. The field effect transistor as claimed in claim 1:
wherein the doping atoms of the first conductivity type are electron donors, and
wherein the doping atoms of the second conductivity type are electron acceptors.

6. The field effect transistor as claimed in claim 1,
wherein the doping atoms of the first conductivity type are electron acceptors, and
wherein the doping atoms of the second conductivity type are electron donors.

7. The field effect transistor as claimed in claim 1, further comprising a second well region, wherein the source region is arranged, the second well region being doped with doping atoms of the second conductivity type.

8. The field effect transistor as claimed in claim 1, wherein the gate region is formed from polysilicon.

9. The field effect transistor as claimed in claim 1, further comprising an insulator structure between the channel region which is doped with doping atoms of the second conductivity type and the drain region.

10. The field effect transistor as claimed in claim 9, wherein the insulator structure is a trench filled with electrically insulating material.

11. The field effect transistor as claimed in claim 1, wherein the insulator structure is formed such that a space charge zone can form from the drain region around the insulator structure as far as the channel region.

12. The field effect transistor as claimed in claim 7, wherein the first well region and the second well region are arranged at a predetermined distance from one another in the substrate.

13. The field effect transistor as claimed in claim 7, further comprising a third well region below the first well region and the second well region.

14. The field effect transistor as claimed in claim 1, wherein the field effect transistor is an input/output driver field effect transistor or an ESD protection field effect transistor.

15. The field effect transistor as claimed in claim 1, wherein the field effect transistor is an input/output driver field effect transistor and an ESD protection field effect transistor.

16. A field effect transistor, comprising
a source region;
a drain region;
a first well region, in which the drain region is arranged, the first well region and the drain region being doped with doping atoms of the same conductivity type;
a channel region between the source region and the drain region, a portion of the channel region located in the first well region;
a gate insulation layer above the channel region, the channel region extending over the entire length of the gate insulation layer or as far as an insulator structure formed between the source region and the drain region;
a gate region above the gate insulation layer;
at least a part of the portion of the channel region which is located in the first well region being doped with doping atoms of a second conductivity type different from that of the drain region;
wherein the doping atoms of the second conductivity type is implanted into the part of the channel region using a process step for setting the field effect transistor threshold voltage
wherein the part of the channel region which is doped with doping atoms of the second conductivity type is formed in a surface region of the channel region; and
wherein the surface region extends from a region arranged at a distance of at least 5 nm from the upper interface of the channel region to a maximum of 40 nm into the substrate in or on which the field effect transistor is formed.

17. A field effect transistor, comprising
a source region being doped with doping atoms of a first conductivity type;
a drain region being doped with doping atoms of the first conductivity type;
a first well region, in which the drain region is arranged, the first well region being doped with doping atoms of the first conductivity type;
a channel region between the source region and the drain region, a portion of the channel region being located in the first well region;
a gate insulation layer above the channel region, the channel region extending over the entire length of the gate insulation layer or as far as an insulator structure formed between the source region and the drain region;
a gate region above the gate insulation layer;
at least a part of the portion of the channel region which is located in the first well region being doped with doping atoms of a second conductivity type, the second conductivity type being a different conductivity type than the first conductivity type;
the doping atoms of the second conductivity type being implanted into the part of the channel region using a process step for setting the field effect transistor threshold voltage;
the part of the channel region which is doped with doping atoms of the second conductivity type being formed in a surface region of the channel region; and
the surface region extending from a region arranged at a distance of at least 10 nm from the upper interface of the channel region to a maximum of 20 nm into the substrate in or on which the field effect transistor is formed.

18. A method for producing a field effect transistor, the method comprising:
forming a first well region, the first well region being doped with doping atoms of a first conductivity type;
doping a portion of the first well region with doping atoms of a second conductivity type, the second conductivity type being a different conductivity type than the first conductivity type, and the doping atoms of the second conductivity type being implanted into the portion of the first well region using a process step for setting the field effect transistor threshold voltage;
forming a source region, the source region being doped with doping atoms of the first conductivity type;
forming a drain region in the first well region, the drain region being doped with doping atoms of the first conductivity type;
forming a channel region between the source region and the drain region, the channel region partly extending into the first well region and containing at least a part of the portion of the first well region which is doped with doping atoms of the second conductivity type;
forming a gate insulation layer above the channel region, the channel region extending over the entire length of the gate insulation layer or as far as an insulator structure formed between the source region and the drain region; and
forming a gate region above the gate insulation layer;
wherein the part of the channel region which is doped with doping atoms of the second conductivity type is formed in a surface region of the channel region, wherein the surface region extends from a region arranged at a distance of at least 5 nm from the upper interface of the channel region to a maximum of 40 nm into the substrate in or on which the field effect transistor is formed.

19. The method as claimed in claim 18, further comprising the step of implanting the doping atoms of the second conductivity type into the portion of the first well region.

20. The method as claimed in claim 19, further comprising the step of forming an insulator structure in the first well region.

21. The method as claimed in claim 18, further comprising the steps of:
forming a second well region, the second well region being doped with doping atoms of the second conductivity type; and
forming the source region in the second well region.

* * * * *